United States Patent
Gries et al.

(10) Patent No.: US 7,186,498 B2
(45) Date of Patent: Mar. 6, 2007

(54) ALKALINE DEVELOPER FOR RADIATION SENSITIVE COMPOSITIONS

(76) Inventors: Willi-Kurt Gries, c/o Agfa-Gevaert N.V., Septestraat 27, B2640 Mortsel (BE); Marc Van Damme, c/o Agfa-Gevaert N.V., Septestraat 27, B2640 Mortsel (BE); Pascal Meeus, c/o Agfa-Gevaert N.V., Septestraat 27, B2640 Mortsel (BE); Mario Boxhorn, c/o Agfa-Gevaert N.V., Septestraat 27, B2640 Mortsel (BE)

( * ) Notice: Subject to any disclaimer, the term of this patent is extended or adjusted under 35 U.S.C. 154(b) by 0 days.

(21) Appl. No.: 10/956,871

(22) Filed: Oct. 1, 2004

(65) Prior Publication Data
US 2005/0106510 A1 May 19, 2005

Related U.S. Application Data
(60) Provisional application No. 60/510,935, filed on Oct. 14, 2003.

(30) Foreign Application Priority Data
Oct. 2, 2003 (EP) .................... 03103643

(51) Int. Cl.
*G03F 7/32* (2006.01)
(52) U.S. Cl. ............... 430/331; 430/302; 510/175; 510/180; 510/181
(58) Field of Classification Search .......... 430/331, 430/302; 510/175, 180, 181, 245, 365, 413, 510/414, 537, 385
See application file for complete search history.

(56) References Cited

U.S. PATENT DOCUMENTS

| 4,436,807 A | 3/1984 | Walls |
| 5,900,352 A | 5/1999 | Elsaesser et al. |
| 6,365,330 B1 | 4/2002 | Leichsenring et al. |

FOREIGN PATENT DOCUMENTS

| EP | 0 099 003 A2 | 1/1984 |
| EP | 0 366 321 A2 | 5/1990 |
| EP | 0 720 060 A1 | 7/1996 |
| EP | 0 732 628 A1 | 9/1996 |
| EP | 0 992 854 A1 | 4/2000 |
| EP | 0 134 407 A1 | 3/2005 |

OTHER PUBLICATIONS

Search Report for EP 03 10 3643 (Mar. 5, 2004).

*Primary Examiner*—Hoa Van Le
(74) *Attorney, Agent, or Firm*—Leydig, Voit & Mayer, Ltd.

(57) ABSTRACT

The invention relates to an alkaline developer for irradiated radiation sensitive compositions, which developer is based on water and at least one inorganic salt having an alkaline reaction, wherein the developer has a pH of at least 11 and comprises at least three structurally different surfactants of formulae (A), (B) and (C), characterised in that the surfactant of formula (A) has one anionic group, the surfactant of formula (B) has two anionic groups, the surfactant of formula (C) is non-ionic and has at least one non-ionic hydrophilic group, and the concentration of each of the surfactants of formulae (A), (B) and (C) in the developer is at least 0.05 weight-% based on the total weight of the developer. The developer leads to less depositions and has a superior stability when used.

18 Claims, No Drawings

ALKALINE DEVELOPER FOR RADIATION SENSITIVE COMPOSITIONS

This application claims the benefit of U.S. Provisional Patent Application No. 60/510,935, filed Oct. 14, 2003; and EP Patent Application No. 03103643.7, filed Oct. 2, 2003, which are incorporated by reference in their entirety.

FIELD OF THE INVENTION

The present invention relates to an alkaline developer for irradiated radiation sensitive compositions, which developer is based on water and contains at least one inorganic salt having an alkaline reaction. The present invention also relates to an alkaline developer for irradiated lithographic printing plate precursors and a method to develop a lithographic printing plate precursor therewith.

BACKGROUND OF THE INVENTION

It is well known in the prior art to add surfactants to alkaline developing compositions. For example it is known from EP 099 003 and EP 134 407 to use an anionic surfactant in a developer that has a pH of from 8 to 12, wherein the surfactant is added to stabilize the solution at low temperature.

According to EP 366 321 a surfactant is added to prevent overdevelopment of positive working compositions, which surfactant may be non-ionic such as polyoxyethylene lauryl ether or an ethylene oxide/propylene oxide condensate of poly(ethylene)glycol; the latter being prefered since it also prevents soiling deposits being formed on the plate surface when developing radiation sensitive plates in some automatic plate processors using hard water in their plate washing section. The pH of the developer is not given explicitely.

From EP 720 060 it is known to use one or more surfactant to adjust the surface tension and thereby allow a fast wetting of the sensitive layer, in particular when spraying the developer on the plate. Cationic, anionic, betainic and non-ionic surfactants, alone or in combination, are disclosed to be suitable therefore without further specification. EP 720 060 is related to alkaline developers, but the pH is not explicitely disclosed.

Aqueous alkaline developing solutions are known from EP 732 628, that comprise a non-ionic surfactant and at least another surfactant selected from anionic or amphoteric surfactants. Said developing solutions allow a reduced amount of sludge and less foam.

According to EP 992 854 an amphoteric and at least one anionic surfactant are used together with an N-alkoxylated amine in an alkaline aqueous developer concentrate. Said developer concentrate makes a developer possible having a high development capacity and a reduced tendency of forming unwanted depositions on the developed plates and in the processing apparatus. The amphoteric surfactant disclosed in EP 992 854 preferably is an aminoacid, a salt thereof or an alkylamidoalkylbetain and the anionic surfactants preferably are $C_2$- to $C_{16}$-alkyl or aryl sulfates. In addition, the concentrate of EP 992 854 can further contain ingredients like non-inonic and cationic surfactants. The addition of N-alkoxylated amines has the tendency to increase the turbidity of the resulting developers. Thus these developers can give increased settlement, which reduces the circulation in the processor. The consequence is a continuous reduction of circulation flow during usage, which finally can end up in a blockage of processors's spray bars. On the other hand most of the settlements remain in the processor and need to be removed at the end using special cleaning agents.

There still is a demanding need to further reduce depositions in the developing apparatus and on the processed printing plates, especially during long run processing. Moreover, the sedimentation stability of used developers is unsatisfactory for known compositions, what is problematic in batch processing with long dwell times between said batches.

The depositions when using a developer according to the state of the art are formed from already detached components of the layer, that are unsufficiently dissolved or dispergated and are deposited on the recording material again or are carried into downstream stations (washbath, gumming station) of the developing machine. Already developed recording materials may become useless in this way. It is mainly during development in machines that components of the layer which are contained in the developer in the form of cakes, filaments or pigment residues, are deposited on the printing plates. In addition, such depositions are formed in the developing machine reducing the circulation flow and decreasing the efficiency of processing, whereby the cleaning effort at the end is high and often aggressive cleaning agents have to be used.

OBJECTS OF THE INVENTION

It is therefore an object of the present invention to provide an alkaline developer for irradiated radiation sensitive compositions, that leads to less depositions in the developing apparatus and on the processed printing plates, especially during long run processing. A further advantage of the developer of the present invention is, that such developers, when used, have an increased sedimentation stability.

Therefore it is a further target of the present invention to find a developer, which results in a stable process with constant circulation flow in the processor and a low cleaning effort at the end of the process, giving reduced settlements, which easily can be removed with plain water.

Further aspects and advantages of the invention will become apparent from the description hereinafter.

SUMMARY OF THE INVENTION

The present invention provides an alkaline developer for irradiated radiation sensitive compositions, which developer is based on water and at least one inorganic salt having an alkaline reaction, wherein the developer has a pH of at least 11 and comprises at least three structurally different surfactants of specific formulae, that surprisingly lead to less depositions and has a superior stability when used.

DETAILED DESCRIPTION OF THE INVENTION

The present invention relates to an alkaline developer for irradiated radiation sensitive compositions, which developer is based on water and at least one inorganic salt having an alkaline reaction, wherein the developer has a pH of at least 11 and comprises at least three structurally different surfactants of formulae (A), (B) and (C), characterised in that the surfactant of formula (A) has one anionic group, the surfactant of formula (B) has two anionic groups, the surfactant of formula (C) is non-ionic and has at least one non-ionic hydrophilic group, and the concentration of each of the surfactants of formulae (A), (B) and (C) in the developer is at least 0.05 weight-% based on the total weight of the developer.

The inorganic salt having an alkaline reaction in water is preferably an alkali metal hydroxide, an alkaline earth metal hydroxide or an ammonium hydroxide, in particular LiOH, KOH or NaOH, or an alkali metal, alkaline earth metal or ammonium salt of an inorganic or organic acid, in particular sodium dihydrogen phosphate or potassium dihydrogen phosphate, disodium hydrogen phosphate or dipotassium hydrogen phosphate, alkali metal silicates like sodium metasilicate or potassium metasilicate, sodium borate, an alkali metal salt of an aliphatic, aromatic or araliphatic carboxylic acid, in particular an alkali metal salt of a ($C_2$–$C_{10}$)alkanoic acid or of a ($C_3$–$C_{12}$)alkoxyalkanoic acid.

The amount of the alkaline agent is in general from 0.5 to 25% by weight, preferably from 0.7 to 15% by weight, based in each case on the total weight of the concentrate. The pH of the concentrate is in general at least 11, preferably at least 12.

As usual, the surfactants of formulae (A), (B) and (C) comprise at least a hydrophobic and a hydrophilic part respectively, and the anionic and non-ionic groups represent the hydrophilic part or at least a part of it.

Hydrophobic groups suitable for the present invention preferably contain more than 6 carbon atoms, from 6 to 20 carbon atoms, and in particular from 8 to 18 carbon atoms being further preferred. Particularly preferred hydrophobic groups of the invention are selected from ethylhexyl, octyl, decyl, dodecyl, tetradecyl, octadecyl, isotridecyl or mixtures thereof or from alkyl mixtures generated from natural sources like coconut oil, rapeseed oil or tallow fat. The hydrophobic groups of the invention can be straight chain or branched alkyl groups or can be a mixture of straight chain and branched alkyl groups. Preferably the hydrophobic groups of the invention are straight chain or a mixture of straight chain and branched alkyl groups and particular preferred the hydrophobic groups of the invention are predominantly straight chain. For the present invention predominantly straight chain means that at least 80 mol-%, more preferred at least 90 mol-% and in particular at least 98 mol-% of the hydrophobic alkyl groups are straight chain.

Examples for anionic groups suitable for the present invention are phosphate, phosphonate, sulfate, sulfonate and carboxylate. Particularly preferred anionic groups of the invention are sulfonate and carboxylate groups.

Non-ionic hydrophilic groups suitable for the present invention preferably contain more than 2 carbon atoms, more than 4 carbon atoms, and in particular from 6 to 200 carbon atoms being further preferred. Particularly preferred non-ionic hydrophilic groups of the invention comprise polyethyleneoxide groups having from 3 to 100 ethyleneoxide units.

In a highly preferred embodiment of the present invention, the surfactants of formulae (A) and (B) are both amphoteric. An amphoteric surfactant according to the present invention comprises at least a nitrogen atom, a hydrophobic group and an anionic group. Preferably the nitrogen is part of an amino group, secondary and tertiary amino groups being preferred. Surfactants of formula (A) preferably comprise a secondary amino group, and the nitrogen atom thereof is substituted with a hydrophobic group and with a substituent comprising a linking group and an anionic group, whereas surfactants of formula (B) preferably comprise a tertiary amino group, and the nitrogen atom thereof is substituted with a hydrophobic group and with two substituents each comprising a linking group and an anionic group. Preferred linking groups are alkylene groups, in particular methylene and ethylene groups and preferred anionic groups are those, that are deprotonised at the pH value of the developer of the invention, in particular sulfonyl and carboxyl groups.

Preferred surfactants of formula (A) are those of formula (I)

wherein
$R^1$ represents a substituted or unsubstituted alkyl group having at least 6 carbon atoms,
$R^2$ represents H or has the same meaning as $R^1$,
$X^1$ represents a substituted or unsubstituted alkenyl group,
$Z^1$ represents —COO, —SO$_3$, —OSO$_3$, —PO$_3$Y or —OPO$_3$Y, and
Y(+) represents a cation to compensate the charge;

preferred surfactants of formula (B) are those of formula (II)

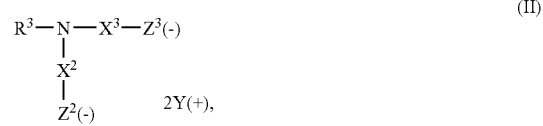

wherein
$R^3$ represents a substituted or unsubstituted alkyl group having at least 6 carbon atoms,
$X^2$, $X^3$ independently represent a substituted or unsubstituted alkenyl group,
$Z^2$, $Z^3$ independently represent —COO, —SO$_3$, —OSO$_3$, —PO$_3$Y or —OPO$_3$Y, and
Y(+) has the same meaning as defined above;

and preferred surfactants of formula (C) are those of formula (III)

wherein
$R^4$ represents a substituted or unsubstituted alkyl group having at least 6 carbon atoms,
$R^5$ represents —O—(—CH$_2$—CH$_2$—O—)$_x$—H, and
x is an integer from 3 to 100.

The alkyl and alkenyl groups can be substituted, for example, by alkyl, alkenyl, alkyne, alkylene, aryl, heterocyclyl, hydroxy, carboxy, halogen, alkoxy, aryloxy, heterocyclyloxy, alkylthio, arylthio, heterocyclylthio, alkylseleno, arylseleno, heterocyclseleno, acyl, acyloxy, acylamino, cyano, nitro, amino, thio or mercapto groups, wherein a heterocyclyl represents a saturated, unsaturated or aromatic heterocyclic radical and an acyl represents the radical of an aliphatic, olefinic or aromatic carboxylic, carbamic, sulphonic, amido sulphonic, phosphoric, phosphonic, phosphorous, phosphinic or sulphinic acid. The substituents are selected in such a way, that $R^1$, $R^3$ and $R^4$ retain their hydrophobic character and $Z^1(-)$, $Z^2(-)$ and $Z^3(-)$ retain their hydrohilic character.

In a particular preferred embodiment of the present invention, the formulae of the present invention are characterized as follows:
$R^1$, $R^3$, $R^4$ independently represent an unsubstituted alkyl group having 8 to 18 carbon atoms, $R^2$ represents H, at least one of
$Z^1$, $Z^2$, $Z^3$ represents —COO, at least one of
$X^1$, $X^2$, $X^3$ represents —$CH_2CH_2$—,
x is an integer from 5 to 40
Y represents an alkali metal ion, a tetraalkylammonium ion or a tetra (hydroxyalkyl)ammonium ion.

In a further preferred embodiment of the present invention, $R^1$, $R^3$ and $R^4$ are selected to be chemically close to each other. The term chemically close to each other means in the context of the present invention a similar or the same substitution and/or a similar or the same chain length and/or a similar or the same configuration (straight chain or branched) of the hydrophobic alkyl groups $R^1$, $R^3$ and $R^4$. A similar chain length according to the present invention means, that the mean number of carbon atoms of the alkyl groups represented by $R^1$, $R^3$ and $R^4$ respectively don't differ by more than 6, and particular preferred don't differ by more than 3, wherein the mean number of carbon atoms is calculated for isomeric mixtures with respect to their molar percentage.

In a highly preferred embodiment of the present invention $Z^1$, $Z^2$ and $Z^3$ all represent —COO and/or $X^1$, $X^2$ and $X^3$ all represent —$CH_2CH_2$—. Most advantageous results with respect to objects of the present invention are obtained, if $Z^1$, $Z^2$ and $Z^3$ all represent —COO and $X^1$, $X^2$ and $X^3$ all represent —$CH_2CH_2$—. The developer of the present invention contains at least 0.05 weight-% (wt. %) of each of the surfactants of formulae (A), (B) and (C). Preferably, the developer contains 0.05 to 6.0 wt.-%, and particularly preferred from 0.10 to 3.0 wt. % of each of said surfactants. The overall amount of all surfactants used in the developer preferably ranges from 0.15 to 18.0 wt.-%, 0.30 to 9.0 wt. % being particularly preferred, wherein the wt. % are based in each case on the total weight of the developer.

Examples of preferred compounds of formulae (I), (II) and (IE) are listed in the tables below. In the tables each formula discloses more than one compound.

As an example formula (I-1) represents: (I-1a) the free acid (Metal=H); (I-1b) the sodium salt (Metal=Na); and (I-1c) the potassium salt (Metal=K). The same holds for (I-2) to (I-8).

As an example formula (II-1) represents: (II-1a) Metals=H and H; (II-1b) Metals=H and Na; (II-1c) Metals=H and K; (II-1d) Metals=Na and Na; (II-1e) Metals=Na and K; and (II-1f) Metals=K and K. The same holds for (II-2) to (II-8).

As an example formula (III-1) represents: (III-1a) n=3; (III-1b) n=5; (III-1c) n=6; (III-1d) n=7; (III-1e) n=8; and (III-1f) n=11. The same holds for (III-2) to (III-10) accordingly.

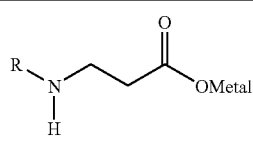

| | R | Metal |
|---|---|---|
| (I-1) | n-Decyl | H, Na or K |
| (I-2) | n-Dodecyl | H, Na or K |
| (I-3) | n-Tetradecyl | H, Na or K |
| (I-4) | n-Hexadecyl | H, Na or K |
| (I-5) | n-Octadecyl | H, Na or K |
| (I-6) | Coco-alkyl ( = n-$C_8$–$C_{18}$) | H, Na or K |
| (I-7) | Oleyl ( = n-$C_{10}$–$C_{18}$) | H, Na or K |
| (I-8) | Tallow-alkyl ( = n-$C_{12}$–$C_{18}$) | H, Na or K |

-continued

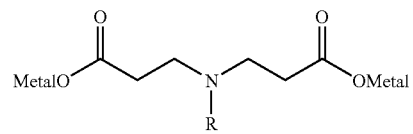

| | R | Metal |
|---|---|---|
| (II-1) | n-Decyl | H, Na, K or mixture |
| (II-2) | n-Dodecyl | H, Na, K or mixture |
| (II-3) | n-Tetradecyl | H, Na, K or mixture |
| (II-4) | n-Hexadecyl | H, Na, K or mixture |
| (II-5) | n-Octadecyl | H, Na, K or mixture |
| (II-6) | Coco-alkyl ( = n-$C_8$–$C_{18}$) | H, Na, K or mixture |
| (II-7) | Oleyl ( = n-$C_{10}$–$C_{18}$) | H, Na, K or mixture |
| (II-8) | Tallow-alkyl ( = n-$C_{12}$–$C_{18}$) | H, Na, K or mixture |

| | R | n |
|---|---|---|
| (III-1) | n-$C_{10}$-alkyl | 3, 5, 6, 7, 8 or 11 |
| (III-2) | n-$C_{11}$-alkyl | 3, 5, 7, 8 or 11 |
| (III-3) | n-$C_{13}$-alkyl | 5, 6, 8, 9 or 15 |
| (III-4) | n-($C_{12}$–$C_{14}$)-alkyl | 3, 4, 5 or 7 |
| (III-5) | n-($C_{12}$–$C_{15}$)-alkyl | 5, 6, 7, 8 or 10 |
| (III-6) | n-($C_{13}$–$C_{15}$)-alkyl | 3, 4, 5, 7, 8, 10 or 30 |
| (III-7) | n-($C_{14}$–$C_{15}$)-alkyl | 4, 7 or 8 |
| (III-8) | Coco-alkyl ( = n-$C_8$–$C_{18}$) | 5, 8, 10, 20 or 25 |
| (III-9) | Oleyl ( = n-$C_{10}$–$C_{18}$) | 5, 8, 10, 15, 20 or 30 |
| (III-10) | Tallow-alkyl ( = n-$C_{12}$–$C_{18}$) | 8, 11, 15, 20, 25 or 30 |

The developer according to the present invention preferably contains further components, that are selected as known in the art depending on the type of the recording materials to be developed. Particular preferred components used for the developer of the present invention are chelating agents and/or dispersants/emulsifiers and/or other additives like solubilizers e. g. aliphatic or aromatic alcohols, antifoaming agents, coloring dyes, oxidation stabilizers and others.

The chelating agents used for the developer of the present invention are selected from low molecular and/or polymeric compounds. According to the definition of W. L. Howard and D. Wilson, Kirk-Othmer Encyclopedia of Chemical Technology 2003 (online posting date Jul. 18, 2003, a chelating agent, or chelant, contains two or more electron donor atoms that can form coordinate bonds to a single metal atom. Preferred chelating agents are selected from phosphorus containing compounds like phosphates, phosphonates or aminophosphonates, hydroxycarboxylates, aminocarboxylates, diketones, polyamines, aminoalcohols, oximes, Schiff bases, sulfur containing compounds, aromatic compounds like phenols, aminophenols, aromatic heterocyclic compounds like pyridines, pyrrols or phenanthrolines, ether compounds like macrocylic crown ethers or cryptates. Basicly the electron donating functionalities are incorporated in organic molecules. The molecular weight of these compounds can range from typical values for single organic compounds to materials of oligomeric or polymeric structure. Examples of such materials are e. g. alkali or ammonium salts of di- or triphosphoric acid, of metaphosphoric acid, of hydroxyethylene diphosphonic acid, of amino tri (methylenephosphonic acid), of ethylenediaminetetra(methylenephosphonic acid), of diethylenetriaminepenta(methylenephosphonic acid), of tartaric acid, of citric acid, of gluconic acid, of 5-sulfosalicyclic acid, of dicarboxyinulin, of ethylenediaminetetraacetic acid, of hydroxyethylethylenediaminetriacetic acid, of nitrilotriacetic acid, of n-dihydroxyethylglycine, of ethylenebis(hydroxyphenylglycine), of methylglycintriacetic acid, of N-(1,2-dicarboxyethyl)aspartic acid, of poly(aspartic acid) derivatives, of poly(p-vinylbenzyliminodiacetic acid), acetylacetone, trifluoroacetylacetone, thenoyltrifluoracetone, ethylenediamine, diethylenetriamine, triethylenetetramine, triaminotriethylamine, polyethyleneimines, triethanolamine, diethanolamine, monoethanolamine, N-alkylated ethanolamines, 2-amino-1-butanol, 2-amino-2-methyl-1,3-propanediol, 2-amino-2-methyl-1-propanol, 2-amino-2-ethyl-1,3-propanediol, 2-amino-2-methyl-1-propanol, n-hydroxyethylethylenediamine, tris(hydroxymethyl)aminomethan, dimethylglyoxime, salicylaldoxime, disalicylaldehyde, 1,2-propylenediamine, toluenedithiol, dimercaptopropanol, alkali or ammonium salts of thioglycolic acid, ethyl xanthogenic acid, diethylcarbamic acid, diethyl dithiophosphoric acid, thiurea, dithione, salicylaldehyde, disulfopyrocatechol, chromotropic acid, oxine, 8-hydroxyquinoline, alkali or ammonium salts of oxinesulfonic acid, tetraphenylporphin, phthalocyanine, dipyridyl, o-phenanthroline, dibenzo-[18]-crown-6, 2,2,2-cryptate. In a highly preferred embodiment of the present invention the chelating agent is selected from gluconic acid, an alkali metal, alkaline earth metal or ammonium salt of gluconic acid, or the delta-lactone of gluconic acid. The gluconic acid complexing agents have the further advantage that they are particularly environmentally friendly (they are even used in foods) and readily biodegradable. Furthermore aminoalcohols, like triethanolamine and/or tris(hydroxymethyl)aminomethane are highly preferred. The amount of the chelating agents is in general from 0.05 to 10% by weight, preferably from 0.1 to 5% by weight, based in each case on the total weight of the developer.

The developer of the present invention can also contain an N-alkoxylated, mono- or polyvalent amine, but it is highly preferred, that the developer is essentially free from said N-alkoxylated, mono- or or polyvalent amines. By essentially free is meant less than 2% by weight (wt.-%), in particular less then 1 wt.-%, based on the total weight of the concentrate.

The dispersant preferably used for the developer of the present invention can be selected from a material, which is readily soluble in water having anchoring groups for the interaction with other compounds. The term dispersant is used according to the definition of R. Heusch and K. Reizlein, Ullmann's Encyclopedia of Industrial Chemistry 2002. (online posting dated Jun. 15, 2000). According to this publication dispersants are products or mixtures of products that can promote the formation of a dispersion or stabilize a dispersion. The term dispersion is applied to a system of several phases in which one is continuous and at least one other is finely distributed therein. Dispersants are usually of oligomeric or polymeric structure. The dispersant preferably is selected from polyphosphates, ligninsulfonic acids, formaldehyde condensation products, the latter in particular with aromatic compounds, and protein condensation products. Preferred dispersants are water soluble polymers like poly(ethyleneoxide)polymers or ethyleneoxide copolymers, poly(vinylether) or vinylether copolymers, poly(ethyleneimines) or ethyleneimine copolymers, poly(acrylic(methacrylic) acid) or acrylic(methacrylic) acid copolymers, poly(maleic acid) or maleic acid copolymers, poly(amino acids) or amino acid copolymers, polysaccharides or modified polysaccharides, poly(acrylamide) or acrylamide copolymers, poly(vinylalcohols) or vinylalcohol copolymers, poly(vinylpyrrolidone) or vinylpyrrolidone copolymers. Also suitable are polymers or copolymers with attached groups, which easily can be ionized. Examples of such groups are carboxylic, sulfate, sulfonate or phosphonate anions or amino, amido or heterocyclic amino cations. Anions and cations can be existing in one polymer (polybetaines). In case of copolymers the distribution of the different units can be random or blockwise. An emulsion is also a disperse system consisting of two (or more) mutually insoluble or sparingly soluble liquids (see R. Heusch, Emulsions in Ullmann's Encyclopedia of Industrial Chemistry 2002, online posting date: Jun. 15, 2000). According to this agents used for the preparation of emulsions are termed emulsifiers. Emulsifiers are usually selected from the group of surfactants, preferably from those of the present invention, from the polymers as disclosed for the dispersant of the present invention, and from solid particles. Examples of such solid particles include various types of clays, activated carbon or solidified fats.

The amount of dispersant and/or emulsifier is in general from 0 to 10% by weight, preferably from 0 to 5% by weight, based in each case on the total weight of the developer.

Other additives e. g. solubilizers, antifoaming agents, coloring dyes, oxidation stabilizers and others can also be present. The concentration ranges according to the desirable effect between 0 and 10% by weight, preferably from 0.01 to 5% by weight, based in each case on the total weight of developer.

The developer of the present invention can not only be prepared as a ready-to-use solution, but also e. g. as a replenisher and the present invention is related to all known packaging.

The developer of the present invention is preferably prepared in a ready-to-use concentration, but it also can be prepared as a concentrate, which has to be diluted with water.

The replenisher for the developer of the present invention differs from the developer in that the ready to use concentration therein of the at least one inorganic salt having an alkaline reaction in water is from 1.05 to 5.0 fold, preferably from 1.1 to 3.0 fold, higher and also the concentrations of the other components differ from those of the developer by a factor from 1.0 to 5.0, preferably from 1.0 to 2.0. The replenisher is preferably prepared in a ready to use concentration, but can also be diluted with water from a replenisher concentrate. The replenisher is added to a partly spent developer in order to restore its full activity.

The developer according to the invention is suitable for most of the negative-working recording materials on the market, in particular for those whose reproduction layer is also provided with one or more water-soluble or water-dispersible top coats. A sizeable advantage of the developer according to the invention is its particularly high developing capacity. The consumption of developer per square meter of recording material thus decreases substantially, so that the developer has to be replenished less frequently. The number of developer changes can be reduced, depending on the addition of replenisher. The stoppage of production is thus avoided and the work involved is also reduced. Furthermore, the developing apparatuses can be cleaned by simply washing out with water. Special cleaning agents are no longer required, what saves costs and prevents environmental pollution, as the cleaning agents used to date for this purpose are as a rule dangerous, environmentally harmful and expensive. As deposits onto the developed plates are not observed when using the developer of the present invention, it is therefore also no longer necessary to provide special filters or other apparatuses for separating off solid components in the developing machines.

The developers according to the invention can be used in all known developing apparatuses, for example in emulsion bath machines, flat table machines having rotating or oscillating brushes or (high-pressure) spray developing machines. On the other hand, it was frequently required to date to use special developing apparatuses in which the brushes are encapsulated or completely surrounded by developer in order to avoid undesired foam formation. In addition, it was often necessary to lay the feed lines for the developer under the liquid level, to keep the developer in a special forced circulation or to provide the developing zone with a special cover.

With the developer according to the invention, it is possible to develop a multiplicity of imagewise exposed reproduction layers. These layers can contain, as radiation-sensitive components, diazonium salt polycondensates or combinations of polymerizable, ethylenically unsaturated monomers and photopolymerization initiators. In addition, polymeric binders, plasticizers, sensitizer dyes, other dyes or pigments, control substances, irradiation indicators, surfactants and/or wetting agents may be added.

Particularly suitable binders in radiation-sensitive layers are polymers which are insoluble in water but soluble or at least swellable in organic solvents and in aqueous alkaline solutions. Polymers having pendant carboxyl groups are particularly suitable, for example copolymers having units of (meth)acrylic acid, crotonic acid or maleic monoesters or polymers having hydroxyl groups, some or all of which have been reacted with cyclic dicarboxylic anhydrides. The polymeric binders generally have a molecular weight $M_w$ of from 500 to 1,000,000, in particular from 1000 to 200,000, and an acid number of from 10 to 250, preferably from 20 to 200. Preferred binders are copolymers (mixed polymers) of (meth)acrylic acid, of crotonic acid or of vinylacetic acid. The comonomers are in particular alkyl(meth)acrylates, hydroxyalkyl(meth)acrylates, allyl(meth)acrylates, aryl (meth)acrylates and/or (meth)acrylonitrile. Copolymers of maleic anhydride and unsubstituted or substituted styrenes, unsaturated hydrocarbons, unsaturated ethers or esters may also be mentioned. The anhydride groups contained therein may also be esterified. The amount of the binders in the radiation-sensitive mixture is in general from 10 to 90% by weight, preferably from 15 to 60% by weight.

The monomers in the photopolymerizable mixtures are in general ethylenically unsaturated compounds, in particular acrylic or methacrylic esters of dihydric or polyhydric alcohols. Ethylene glycol di(meth)acrylate, diethylene glycol di(meth)acrylate, (meth)acrylates of trimethylolethane, trimethylolpropane, pentaerythritol, dipentaerythritol and of polyhydric alicyclic alcohols may be mentioned specifically. The reaction products of mono- or diisocyanates with partial esters of polyhydric alcohols can also advantageously be used. Finally, polymerizable compounds which additionally contain photooxidizable groups, if required also urethane groups, are also suitable. The photooxidizable groups are in general amino, urea or thio groups which may also be part of heterocyclic rings. Especially suitable photooxidizable groups are triethanolamino, triphenylamino, thiourea, imidazole, oxazole, thiazole, acetylacetonyl, N-phenylglycine and ascorbic acid groups. Among these, the polymerizable compounds having primary or secondary but in particular tertiary amino groups are preferred.

The photoinitiators can be selected from a number of classes of substances. In particular, derivatives of benzophenone, of acetophenone, of benzoin, of benzil, of fluorenone, of thioxanthone, of acridine or of quinazoline and of polynucleic quinones may be mentioned. Trichloromethyl-s-triazines, 2-halomethyl-5-vinyl-[1,3,4]oxadiazole derivatives, halooxazoles substituted by trichloromethyl groups and carbonyl methylene heterocycles containing trihalomethyl groups (EP-A 135 863=U.S. Pat. No. 4 966 828) also deserve mention. Finally, alkylbisacylphosphine oxides, alkylarylbisacylphosphine oxides, titanocenes, hexaarylbisimidazoles, ferrocenes, azidosulfonylphenylphthalimides, ketoxime ethers, and onium compounds (especially diaryliodonium, diazonium or sulfonium compounds) are also suitable.

The radiation-sensitive layer may contain, as sensitizer dyes, in particular photoreducible xanthene, fluorene, benzoxanthene, benzothioxanthene, thiazine, oxazine, coumarin, pyronine, porphyrin, acridine, azo, diazo, cyanine, merocyanine, diarylmethyl, triarylmethyl, anthraquinone, phenylenediamine, benzimidazole, fluorochrome, quinoline, tetrazole, naphthol, benzidine, rhodamine, indigo and/or indanthrene dyes. Also suitable are optical brighteners. The amount of the sensitizer dyes is in general from 0.01 to 15%, preferably from 0.05 to 5% by weight, based in each case on the total weight of the nonvolatile components of the radiation-sensitive layer.

In order to increase the photosensitivity further, the layer may additionally contain coinitiators. For example, the combination of titanocenes and trichloromethyl-s-triazines, of titanocenes and ketoxime ethers and of acridines and trichloromethyl-s-triazines is known. A further increase in sensitivity can be achieved by adding dibenzalacetone or amino acid derivatives. The amount of the initiator or initiators or coinitiator or coinitiators is in general from 0.01 to 20% by weight, preferably from 0.05 to 10% by weight, based in each case on the total weight of the nonvolatile components of the radiation-sensitive layer.

Dyes or pigments may be added for colouring the radiation-sensitive layer. In general, phthalocyanine, rhodamine, triarylmethane, azo, diazo, anthraquinone, naphthol or phenylenediamine dyes or inorganic coloured pigments are used for this purpose.

In order to establish specific properties, inhibitors and control substances may furthermore be present in the layer. These include benzophenone compounds, phosphorus compounds, cycloacetals, quinones, quinolines, naphthoquinones, anthraquinones, ethers, sterically hindered amines, benzothiazols, thiurams, thiocarbamates, phenols, naphthols, benzimidazoles, mercaptobenzimidazoles and phenylenediamines. The amount of the inhibitors and/or control substances is in general from 0.001 to 10% by weight, preferably from 0.005 to 5% by weight, based in each case on the total weight of the nonvolatile components of the radiation-sensitive layer.

Any topcoats present in the recording materials essentially comprise water-soluble or water-emulsifiable polymeric binders. They may also contain wetting agents, adhesion promoters, antifoams, dyes and other assistants. Such topcoats are likewise known to those skilled in the art.

The developer according to the present invention is primarily intended for the production of printing forms for lithographic printing, letterpress printing, gravure printing or screen printing, and also of photoresist images. However, it can also be used in the production of relief copies (for example of texts in Braille), of tanned images or pigmented images.

The layer support in said printing plates preferably consists of metal, in particular of aluminum, steel, zinc, copper or metal alloys, plastic, in particular polyethylene terephthalate (PET), cellulose acetate or polyamide (PA). Supports for screens consist in particular of Perlon gauze. In the case of photoresists, the support is generally a silicone wafer.

The surface of the supports is in many cases pretreated. Thus, aluminum supports are frequently mechanically and/or chemically and/or electrochemically roughened, anodically oxidized and/or hydrophilized. Such pretreatments result in the reproduction layer adhering better thereon, so that lithographic properties of the support—in particular its water acceptance and water retentivity—are improved or so that the support reflects to a lesser extent during the imagewise exposure (antihalation). The same effect can be achieved by applying to the support special layers which comprise, for example, binders, pigments and, if required, additives.

The radiation-sensitive recording materials are prepared by processes which are known per se to the person skilled in the art. In general, the components of the radiation-sensitive layer are dissolved or dispersed in an organic solvent or solvent mixture, the solution or dispersion is applied to the intended support by pouring on, spraying on, emersion, roll application or in a similar manner and the solvents are removed during the subsequent drying.

The imagewise exposure to radiation is effected by means of tubular lamps, pulsed xenon lamps, xenon arc lamps, metal halide-doped high-pressure mercury vapor lamps and carbon arc lamps. In addition, the exposure to light is possible in conventional projection and enlargement units for the light of the metal filament lamps and with contact exposure to customary tungsten filament lamps. Imagewise exposure can also be effected using coherent light of a laser or UV- or IR laser diodes. Lasers of suitable power, for example argon ion lasers, crypton ion lasers, dye lasers, solid-state lasers, helium-cadmium lasers, helium-neon lasers and laser diodes, which emit in particular between 250 and 1100 nm, particularly between 300 and 1000 nm, are suitable. The laser beam can be controlled by a specified program and the exposure can be performed by movements along the lines and along the grid.

The invention also relates to a process for the production of a negative-working reproduction layer being applied to a support, e. g. a lithographic printing plate. Said support preferably is of aluminum or alloys thereof, and is in particular mechanically and/or chemically and/or electrochemically pretreated and/or hydrophilized. Said reproduction layer (e. g. said lithographic printing plate precursor) being exposed imagewise and then being developed with a developer according to the invention.

The invention is illustrated in more detail by the following examples without limiting it thereto. Unless stated otherwise, parts by weight (p.b.w.) and parts by volume (p.b.v.) bear the same relation as that of g to ml. Percentages and ratios are to be understood as weight units.

EXAMPLES

Example 1

A VSP 85 processor equipped with a 50 µm circulation filter (Glunz & Jensen) was filled with 43 l of the following developer

| | |
|---|---|
| 0.56 p. b. w. | trishydroxymethylaminomethane |
| 7.23 p. b. w. | potassium silicate solution containing 21.5% $K_2O$, 20% $SiO_2$ and 58.5% water |
| 0.30 p. b. w. | potassium hydroxide 88% |

-continued

| | |
|---|---|
| 3.22 p. b. w. | Mackam 151C ® (corresponds to (I-6c), potassium salt) as 40% solution in water |
| 0.67 p. b. w. | Librateric AA-30 ® (corresponds to (II-6b), mono sodium salt) as 30% solution in water |
| 0.34 p. b. w. | Genapol C200 ®(corresponds to (III-8d), n = 20) |
| 1.25 p. b. w. | sodium gluconate |
| 86.41 p. b. w. | deionized water |

The resulting developer had a pH of 12.5 and a conductivity of 35.1 mS/cm. The operating temperature was 28.2+/−0.2° C. Over a period of 3 days the developer was saturated with 500 $m^2$ of non imaged N91® plates. After 50 $m^2$ each a plate carrying different common test elements imaged with a Polaris 100® was processed and evaluated. At the same time the developer was characterized by measuring temperature, pH, conductivity and turbidity.

At the end of the test the developer was removed and an almost clean processor was obtained, which could be easily prepared for the next test by rinsing with plain water.

The observed sensitivities of the plates after 50, 100, 150, 200, 250, 300, 350, 400, 450 and 500 $m^2$ were constant within the limits of precision. A printing test of these plates gave sharp prints without any delay of ink take-up or background toning.

With increasing saturation pH and conductivity decreased. At the same time turbidity increased in dependence of the amount of processed plates.

At the end of the test the filter unit was removed and dried at 120° C. over 12 h under vacuum. The difference to the fresh filter was 24.2 g, which corresponds to the amount of collected sedimentation during operation. In addition to this the exhausted developer was centrifugated using 6000 rpm for 30 minutes. The resulting solution was decanted and the obtained solid was dried within Ih in a circulating ofen at 110° C. 1.25+/−0.01 g/kg solid was obtained.

Comparative Example 1

The test according to example 1 was repeated under the same conditions using the same formulation, but exchanging the surfactants Librateric AA-30® and Genapol C200® by Metolat FC 355® and Leukoglanzöl BPA 50® and adjusting the water as follows:

| | |
|---|---|
| 0.20 p. b. w. | Metolat FC 355 ® |
| 0.79 p. b. w. | Leukoglanzöl BPA 50 ® (corresponds to sulfated castor oil) as 43% solution in water |
| 86.43 p. b. w. | deionized water |

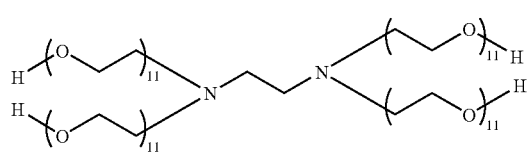

Metolat FC 355®

The resulting solution had a pH of 12.5 and a conductivity of 35.3 mS/cm. The operating temperature was 28.1+/−0.2° C. The behavior of the N91® plate development is comparable to example 1, but at the end of the process a significant amount of sedimentation was recovered within the VSP developer section, which could not be completely removed by plain water. In order to prepare the processor for the next test a dedicated cold cleaner and manually brushing was necessary. The collected sedimentation during operation was 37.0 g and the material isolated by centrifugation 1.76+/−0.02 g/kg indicating a significant higher tendency for settlement formation.

Example 2 and Comparative Examples 2 to 4

A stock solution was prepared as follows:

| | |
|---|---|
| 1294 p. b. w. | deionized water |
| 3.8 p. b. w. | trishydroxymethylaminomethane |
| 160.2 p. b. w. | potassium silicate solution containing 21.5% $K_2O$, 20% $SiO_2$ and 58.5% water |
| 8.3 p. b. w. | triethanolamine as 80% solution in water |
| 19.0 p. b. w. | sodium gluconate |

To 78.2 p. b. w. of this solution surfactants and deionized water were added according to table 1.

TABLE 1

| No. | Mackam 151C (I-6c) p.b.w. 20% in water | Librateric AA-30 (II-6b) p.b.w. 30% in water | Genapol C 200 (III-8d) p.b.w. 10% in water | Water p.b.w. |
|---|---|---|---|---|
| Example 2 | 13.45 | 1.33 | 7.00 | 0 |
| Comparative example 2 | 13.45 | 0 | 0 | 8.33 |
| Comparative example 3 | 13.45 | 0 | 7.00 | 1.33 |
| Comparative example 4 | 13.45 | 1.33 | 0 | 7.00 |

A 40×15 cm sized N91® plate imaged with different test elements was pre-heated and the overcoat was washed off. Then the plate is processed manually in 50 ml of the above described developer solutions at 25° C. within 30 s giving for all examples a comparable sensitivity. The resulting used developers have been stored at room temperature for 7 days. The sedimentation stability was measured by comparing the turbidity values of the unmoved solution at 4 hours with 7 days. The turbidity is given in relative turbidity units (TU) versus formazine (F) that is used as a standard. The results of the different developers are summarized in table 2, and show the surprising advantage, that can only be achieved with the synergistic combination of the three specific surfactants of the present invention.

TABLE 2

Characteristic data and turbidity values

| No. | pH | Conductivity [mS/cm] | Turbidity at 4 h [TU/F] | Turbidity at 7 d [TU/F] | Δ (4 h − 7 d) [TU/F] |
|---|---|---|---|---|---|
| Example 2 | 13.1 | 40 | 192 | 153 | 39 |
| Comparative example 2 | 13.2 | 42 | 229 | 151 | 78 |
| Comparative example 3 | 13.2 | 41 | 204 | 149 | 55 |
| Comparative example 4 | 13.1 | 41 | 204 | 152 | 52 |

Comparative Examples 5 to 7 and Example 3

The solutions have been prepared using the ingredients and their amounts as described in Table 3.

TABLE 3

Compositions for preparation of the developers

| No. | A p.b.w. | B p.b.w. | C p.b.w. | D p.b.w. | E p.b.w. | Water p.b.w. |
|---|---|---|---|---|---|---|
| Comparative example 5 | 60 | 0 | 0 | 3.0 | 12 | 125 |
| Comparative example 6 | 0 | 60 | 0 | 3.0 | 12 | 125 |
| Comparative example 7 | 0 | 0 | 120 | 3.0 | 12 | 65 |
| Example 3 | 20 | 20 | 40 | 3.0 | 12 | 105 |

A=20% solution of Mackam 151C® (I-6c) in water
B=20% solution of Librateric AA-30® (II-6b) in water
C=10% solution of Genapol C200® (II-8d)
D=Sodium gluconate
E=Potassium silicate solution containing 21.5% $K_2O$, 20% $SiO_2$ and 58.5% water A 40×15 cm sized N91 ® plate imaged with different test elements was preheated and the overcoat was wahed off. Then the plate is processed manually in 50 ml of developer solution as desribed in table 3 at 25° C. within 30 s giving for all examples a comparable sensitivity. The resulting used developers have been stored at room temperature for 7 days. After storage the corresponding developer has been homogenized and centrifugated using 6000 rpm for 30 minutes. The resulting solution was decanted and the obtained solid was dried within 1 h in a circulating ofen at 110° C. The resulting solids in g/kg are listed as sedimentation in table 4 together with pH and conductivity of the fresh developers. Again, the advantage of the synergistic tenside combination of the present invention is clearly demonstrated.

TABLE 4

Fresh data and isolated sedimentation of different formulations

| No. | pH | Conductivity [mS/cm] | Sedimentation [g/kg] |
|---|---|---|---|
| Comparative example 5 | 13.0 | 38 | 5.2 |
| Comparative example 6 | 13.0 | 42 | 6.3 |
| Comparative example 7 | 12.9 | 27 | 5.8 |
| Example 3 | 13.0 | 35 | 4.5 |

Example 4

A VSP 85 processor (Glunz & Jensen) was filled with 43 l of the following developer:

| | |
|---|---|
| 0.20 p. b. w. | trishydroxymethylaminomethane |
| 8.43 p. b. w. | potassium silicate solution containing 21.5% $K_2O$, 20% $SiO_2$ and 58.5% water |
| 0.48 p. b. w. | potassium hydroxide 88% |
| 4.83 p. b. w. | Mackam 151C ® (I-6c) as 40% solution in water |
| 0.75 p. b. w. | Luviskol K30 ® (corresponds to poly (vinylpyrrolidone)) |
| 0.33 p. b. w. | Librateric AA-30 ® (II-6b) as 30% solution in water |
| 0.35 p. b. w. | Genapol C200 ® (III-8d) |

| | |
|---|---|
| 1.25 p. b. w. | sodium gluconate |
| 0.03 p. b. w. | Defoamer SE 57 ® (silicon defoamer) |
| 83.35 p. b. w. | deionized water |

The resulting solution had a pH of 12.7 and a conductivity of 40 mS/cm. The operating temperature was 28.2+/−0.2° C. Over a period of 3 days the developer was saturated with 500 m² of non imaged N91® plates without any replenishment. After 50 m² each a plate carrying different common test elements imaged with a Polaris 100® was processed and evaluated.

At the end of the test the developer was removed and only a slightly contamined processor was obtained, which could be easily cleaned by rinsing with plain water. There was no indication for any flow reduction of the spray bars.

The observed sensitivities of the plates after 50, 100, 150, 200, 250, 300, 350, 400, 450 and 500 m² were constant within the limits of precision. A printing test of these plates gave sharp prints without any delay of ink take up or background toning.

Example 5

A dip tank lab processor equipped with integrated pre heat and overcoat wash off section was filled with 8500 g of a developer containing the following ingredients:

| | |
|---|---|
| 370.4 p. b. w. | Mackam 151C ® (I-6c) as 40% solution in water |
| 66.7 p. b. w. | Librateric AA-30 ® (II-6b) as 30% solution in water |
| 350.0 p. b. w. | Genapol C200 ® (III-8d) as 10% solution in water |
| 1.94 p. b. w. | Defoamer SE 57 ® |
| 43.8 p. b. w. | triethanolamine as 80% solution in water |
| 8166 p. b. w. | deionized water |
| 37.8 p. b. w. | potassium hydroxide 85% |
| 100.0 p. b. w. | sodium gluconate |
| 20.0 p. b. w. | trishydroxymethylaminomethane |
| 843.4 p. b. w. | potassium silicate solution containing 21.5% K₂O, 20% SiO₂ and 58.5% water. |

The resulting developer had a pH of 12.7 and a conductivity of 38.5 mS/cm. The operating temperature was 28.3+/−0.3° C. Over a period of 2 days the developer was saturated with 100 m² of non imaged N91® plates. After 10 m² each a plate carrying different common test elements imaged with a Polaris 100® was processed and evaluated. At the same time the developer was characterized by measuring temperature, pH, conductivity and turbidity. The circulating flow of the developer was controlled by using a Turck® flow control unit and by carefully watching the spray bars.

At the end of the test the developer was removed and a clean processor without any sedimentation of products was obtained. The processor could be easily prepared for the next test by rinsing it with plain water.

The observed sensitivities of the plates after 10, 20, 30, 40, 50, 60, 70, 80, 90 and 100 m² were constant within the limits of precision. A printing test of these plates gave sharp prints without any delay of ink take up or background toning.

With increasing saturation pH and conductivity decreased. At the same time turbidity increased in dependence of the amount of processed plates, but the spray bars were all the time free and there was only a slight reduction of flow observable.

Comparative Example 8

The test according to example 1 was repeated under the same conditions using the example 6 from EP 992854.

The resulting solution had a pH of 13.1 and a conductivity of 30 mS/cm. The operating temperature was 28.3+/−0.3° C. Already at 70 m² the test had to be stopped, because the spray bars were completely blocked and there was not developer circulating flow anymore. After removement of the developer the processor was significantly contaminated. The contamination could not be completely removed by water. A special alkaline cold cleaner in combination with mechanical work was necessary to prepare the processor for the next test.

The invention claimed is:

1. An alkaline developer for irradiated radiation sensitive compositions, which developer is based on water and at least one inorganic salt having an alkaline reaction, wherein the developer has a pH of at least 11 and comprises at least three structurally different surfactants of formulae (A), (B) and (C), wherein the surfactants (A) and (B) are both amphoteric and wherein the surfactant of formula (A) has one anionic group, the surfactant of formula (B) has two anionic groups, the surfactant of formula (C) is non-ionic and has at least one non-ionic hydrophilic group comprising a polyethylenoxide group having from 3 to 100 ethylenoxide units, and the concentration of each of the surfactants of formulae (A), (B) and (C) in the developer is at least 0.05 weight-% based on the total weight of the developer.

2. An alkaline developer according to claim 1, wherein the anionic groups are selected from sulfonate and carboxylate groups.

3. An alkaline developer according to claim 1, wherein the surfactant of formula (A) is of formula (I)

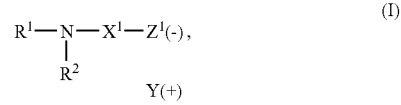

and wherein
$R^1$ represents a substituted or unsubstituted alkyl group having at least 6 carbon atoms,
$R^2$ represents H or has the same meaning as $R^1$,
$X^1$ represents a substituted or unsubstituted alkenyl group,
$Z^1$ represents —COO, —SO$_3$, —OSO$_3$, —PO$_3$Y or —OPO$_3$Y, and
Y represents a cation to compensate for the charge.

4. An alkaline developer according to claim 1, wherein the surfactant of formula (B) is of formula (II)

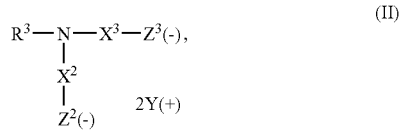

and wherein
$R^3$ represents a substituted or unsubstituted alkyl group having at least 6 carbon atoms,
$X^2$, $X^3$ independently represent a substituted or unsubstituted alkenyl group,
$Z^2$, $Z^3$ independently represent —COO, —SO$_3$, —OSO$_3$, —PO$_3$Y or —OPO$_3$Y, and
Y represents a cation to compensate for the charge.

5. An alkaline developer according to claim 1, wherein the surfactant of formula (C) is of formula (III)

$$R^4—R^5 \quad (III),$$

and wherein
R$^4$ represents a substituted or unsubstituted alkyl group having at least 6 carbon atoms,
R$^5$ represents —O—(—CH$_2$—CH$_2$—O—)$_x$—H, and
x is an integer from 3 to 100.

6. A method of making a lithographic printing plate comprising the steps of imagewise exposing a lithographic printing plate precursor, and processing it in an alkaline developer according to claim 1.

7. An alkaline developer according to claim 2, wherein the surfactant of formula (A) is of formula (I)

$$R^1—N(R^2)—X^1—Z^1(-), \quad Y(+) \quad (I)$$

and wherein
R$^1$ represents a substituted or unsubstituted alkyl group having at least 6 carbon atoms,
R$^2$ represents H or has the same meaning as R$^1$,
X$^1$ represents a substituted or unsubstituted alkenyl group,
Z$^1$ represents —COO, —SO$_3$, —OSO$_3$, —PO$_3$Y or —OPO$_3$Y, and
Y represents a cation to compensate for the charge.

8. An alkaline developer according to claim 2, wherein the surfactant of formula (B) is of formula (II)

$$R^3—N(X^2)(Z^2(-))—X^3—Z^3(-), \quad 2Y(+) \quad (II)$$

and wherein
R$^3$ represents a substituted or unsubstituted alkyl group having at least 6 carbon atoms,
X$^2$, X$^3$ independently represent a substituted or unsubstituted alkenyl group,
Z$^2$, Z$^3$ independently represent —COO, —SO$_3$, —OSO$_3$, —PO$_3$Y or —OPO$_3$Y, and
Y represents a cation to compensate for the charge.

9. An alkaline developer to claim 7, wherein the surfhctant of formula (B) is of formula (II)

$$R^3—N(X^2)(Z^2(-))—X^3—Z^3(-), \quad 2Y(+) \quad (II)$$

and wherein
R$^3$ represents a substituted or unsubstituted alkyl group having at least 6 carbon atoms,
X$^2$, X$^3$ independently represent a substituted or unsubstituted alkenyl group,
Z$^2$, Z$^3$ independently represent —COO, —SO$_3$, —OSO$_3$, —PO$_3$Y or —OPO$_3$Y, and
Y represents a cation to compensate for the charge.

10. An alkaline developer according to claim 3, wherein the surfactant of formula (B) is of formula (II)

$$R^3—N(X^2)(Z^2(-))—X^3—Z^3(-), \quad 2Y(+) \quad (II)$$

and wherein
R$^3$ represents a substituted or unsubsrftuted alkyl group having at least 6 carbon atoms,
X$^2$, X$^3$ independently represent a substituted or unsubstituted alkenyl group,
Z$^2$, Z$^3$ independently represent —COO, —SO$_3$, —OSO$_3$, —PO$_3$Y or —OPO$_3$Y, and
Y represents a cation to compensate for the charge.

11. An alkaline developer according to claim 2, wherein the surfactant of formula (C) is of formula (III)

$$R^4—R^5 \quad (III),$$

and wherein
R$^4$ represents a substituted or unsubstituted alkyl group having at least 6 carbon atoms,
R$^5$ represents —O—(—CH$_2$—CH$_2$—O—)$_x$—H, and
x is an integer from 3 to 100.

12. An alkaline developer according to claim 7, wherein the surfactant of formula (C) is of formula (III)

$$R^4—R^5 \quad (III),$$

and wherein
R$^4$ represents a substituted or unsubstituted alkyl group having at least 6 carbon atoms,
R$^5$ represents —O—(—CH$_2$—CH$_2$—O—)$_x$—H, and
x is an integer from 3 to 100.

13. An alkaline developer according to claim 3, wherein the surfactant of formula (C) is of formula (III)

$$R^4—R^5 \quad (III),$$

and wherein
R$^4$ represents a substituted or unsubstituted alkyl group having at least 6 carbon atoms,
R$^5$ represents —O—(—CH$_2$—CH$_2$—O—)$_x$—H, and
x is an integer from 3 to 100.

14. An alkaline developer according to claim 4, wherein the surfactant of formula (C) is of formula (III)

$$R^4—R^5 \quad (III),$$

and wherein
R$^4$ represents a substituted or unsubstituted alkyl group having at least 6 carbon atoms,
R$^5$ represents —O—(—CH$_2$—CH$_2$—O—)$_x$—H, and
x is an integer from 3 to 100.

15. An alkaline developer according to claim 11, wherein the surfactant of formula (B) is of formula (II)

$$R^3—N(X^2)(Z^2(-))—X^3—Z^3(-), \quad 2Y(+) \quad (II)$$

and wherein
R$^3$ represents a substituted or unsubstituted alkyl group having at least 6 carbon atoms, X², X³ independently represent a substituted or unsubstituted alkenyl group, Z², Z³ independently represent —COO, —SO₃, —OSO₃, —PO₃Y or —OPO₃Y, and Y represents a cation to compensate the charge.

16. An alkaline developer according to claim 12, wherein the surfacrant of formula (B) is of formula (II)

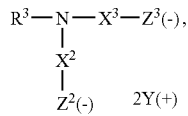 (II)

and wherein

R³ represents a substituted or unsubstituted alkyl group having at least 6 carbon atoms, X², X³ independently represent a substituted or unsubstituted alkenyl group, Z², Z³ independently represent —COO, —SO₃, —OSO₃, —PO₃Y or —OPO₃Y, and Y represents a cation to compensate the charge.

17. An alkaline developer according to claim 14, wherein the surfactant of formula (A) is of formula (I)

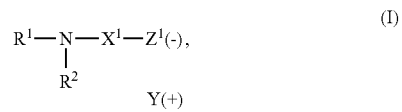 (I)

and wherein

R² represents a substituted or unsubstituted alkyl group having at least 6 carbon atoms, R² represents H or has the same meaning as R¹, X¹ represents a substituted or unsubstituted alkenyl group, Z¹ represents —COO, —SO₃, —OSO₃, —PO₃Y or —OPO₃Y, and Y represents a cation to compensate for the charge.

18. A method of making a lithographic printing plate comprising the steps of imagewise exposing a lithographic printing plate precursor, and processing it in an alkaline developer according to claim 17.

* * * * *

UNITED STATES PATENT AND TRADEMARK OFFICE
CERTIFICATE OF CORRECTION

PATENT NO. : 7,186,498 B2 Page 1 of 1
APPLICATION NO. : 10/956871
DATED : March 6, 2007
INVENTOR(S) : Willi-Kurt Gries et al.

It is certified that error appears in the above-identified patent and that said Letters Patent is hereby corrected as shown below:

Col. 20, line 7

Claim 17, "$R^2$" should read -- $R^1$ --.

Signed and Sealed this

Eighth Day of July, 2008

JON W. DUDAS
*Director of the United States Patent and Trademark Office*